United States Patent
Cismaru et al.

(10) Patent No.: US 9,461,153 B2
(45) Date of Patent: Oct. 4, 2016

(54) DEVICES AND METHODS RELATED TO A BARRIER FOR METALLIZATION OF A GALLIUM BASED SEMICONDUCTOR

(71) Applicant: Skyworks Solutions, Inc., Woburn, MA (US)

(72) Inventors: Cristian Cismaru, Newbury Park, CA (US); Peter J. Zampardi, Jr., Newbury Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 155 days.

(21) Appl. No.: 13/675,814

(22) Filed: Nov. 13, 2012

(65) Prior Publication Data

US 2013/0137382 A1    May 30, 2013

Related U.S. Application Data

(60) Provisional application No. 61/560,400, filed on Nov. 16, 2011.

(51) Int. Cl.
*H01L 29/737* (2006.01)
*H01L 21/66* (2006.01)
(Continued)

(52) U.S. Cl.
CPC ............. *H01L 29/737* (2013.01); *H01L 22/14* (2013.01); *H01L 29/0692* (2013.01); *H01L 29/41708* (2013.01); *H01L 29/66242* (2013.01); *H01L 29/7371* (2013.01); *H04M 1/026* (2013.01);
(Continued)

(58) Field of Classification Search
CPC ........................ H01L 29/41708; H01L 29/737
USPC ............................. 257/197, 198; 438/14, 393
See application file for complete search history.

(56) References Cited

U.S. PATENT DOCUMENTS 3,233,196 A    2/1966 Hiroe et al.
4,461,956 A    7/1984 Hatanaka et al.
(Continued)

FOREIGN PATENT DOCUMENTS

EP    1662557 A1    5/2006
JP    2005-116773 A    4/2005
(Continued)

OTHER PUBLICATIONS

Fu et al. "Comprehensive investigation on emitter ledge length of InGaP/GaAs heterojunction bipolar transistors," J. Vac. Sci. Technol. B 25(3) May/Jun. 2007, pp. 691-696.*
(Continued)

*Primary Examiner* — Allen Parker
*Assistant Examiner* — Stephen Bradley
(74) *Attorney, Agent, or Firm* — Knobbe, Martens, Olson & Bear, LLP

(57) ABSTRACT

Disclosed are structures and methods related to a barrier layer for metallization of a selected semiconductor such as indium gallium phosphide (InGaP). In some embodiments, the barrier layer can include tantalum nitride (TaN). Such a barrier layer can provide desirable features such as barrier functionality, improved adhesion of a metal layer, reduced diffusion, reduced reactivity between the metal and InGaP, and stability during the fabrication process. In some embodiments, structures formed in such a manner can be configured as an emitter of a gallium arsenide (GaAs) heterojunction bipolar transistor (HBT) or an on-die high-value capacitance element.

20 Claims, 10 Drawing Sheets

(51) Int. Cl.
  *H04M 1/02* (2006.01)
  *H01L 29/417* (2006.01)
  *H01L 29/66* (2006.01)
  *H01L 29/06* (2006.01)

(52) U.S. Cl.
  CPC ........... *H01L 2224/05554* (2013.01); *H01L 2224/48091* (2013.01); *H01L 2224/49171* (2013.01); *H01L 2924/12032* (2013.01); *H01L 2924/1305* (2013.01); *H01L 2924/15184* (2013.01); *H01L 2924/15192* (2013.01)

(56) References Cited

U.S. PATENT DOCUMENTS

| | | | |
|---|---|---|---|
| 4,751,201 A | 6/1988 | Nottenburg et al. | |
| 4,871,686 A | 10/1989 | Davies | |
| 4,920,078 A | 4/1990 | Bagley et al. | |
| 4,933,732 A | 6/1990 | Katoh et al. | |
| 4,939,562 A | 7/1990 | Alderstein | |
| 5,378,922 A | 1/1995 | Sovero | |
| 5,455,440 A | 10/1995 | Henderson et al. | |
| 5,670,801 A | 9/1997 | Nakano | |
| 5,837,589 A | 11/1998 | McNamara | |
| 5,864,169 A | 1/1999 | Shimura | |
| 5,986,324 A * | 11/1999 | Adlerstein | H01L 29/7371 257/522 |
| 6,388,526 B1 | 5/2002 | Daniel et al. | |
| 6,392,258 B1 | 5/2002 | Hirata et al. | |
| 6,406,965 B1 | 6/2002 | Lammert | |
| 6,576,937 B2 | 6/2003 | Takazawa | |
| 6,673,687 B1 | 1/2004 | Burton et al. | |
| 6,680,494 B2 | 1/2004 | Gutierrez-Aitken | |
| 6,803,643 B2 | 10/2004 | Winslow | |
| 6,913,938 B2 | 7/2005 | Shanmugasundram et al. | |
| 7,082,346 B2 | 7/2006 | Saki et al. | |
| 7,109,408 B2 | 9/2006 | Kucherov et al. | |
| 7,109,534 B2 | 9/2006 | Kondo | |
| 7,242,038 B2 | 7/2007 | Oda et al. | |
| 7,420,227 B2 | 9/2008 | Chang et al. | |
| 7,875,523 B1 | 1/2011 | Fields | |
| 8,082,054 B2 | 12/2011 | Yamaji | |
| 2001/0016377 A1 | 8/2001 | Mizutani | |
| 2001/0048120 A1* | 12/2001 | Shimawaki | 257/198 |
| 2003/0017256 A1 | 1/2003 | Shimane | |
| 2003/0038341 A1 | 2/2003 | Bayraktaroglu | |
| 2003/0073255 A1 | 4/2003 | Narayanan et al. | |
| 2003/0157775 A1 | 8/2003 | Kurokawa et al. | |
| 2003/0183846 A1 | 10/2003 | Oguri | |
| 2003/0213973 A1 | 11/2003 | Yoshioka et al. | |
| 2004/0016941 A1 | 1/2004 | Yanagisawa et al. | |
| 2004/0149330 A1 | 8/2004 | Sugiyama et al. | |
| 2005/0029625 A1 | 2/2005 | Hussain et al. | |
| 2005/0035370 A1 | 2/2005 | Chen | |
| 2005/0134293 A1 | 6/2005 | Sergoyan et al. | |
| 2006/0054998 A1* | 3/2006 | Chantre | H01L 29/0817 257/575 |
| 2006/0138460 A1* | 6/2006 | Sasaki et al. | 257/197 |
| 2007/0012949 A1 | 1/2007 | Kawashima et al. | |
| 2007/0023783 A1 | 2/2007 | Hase et al. | |
| 2007/0040274 A1* | 2/2007 | Lee et al. | 257/751 |
| 2007/0045774 A1 | 3/2007 | Huber et al. | |
| 2007/0205430 A1 | 9/2007 | Collins et al. | |
| 2007/0205432 A1 | 9/2007 | Tsukao | |
| 2007/0210340 A1* | 9/2007 | Zampardi et al. | 257/213 |
| 2008/0054370 A1* | 3/2008 | Naito | H01L 21/28088 257/378 |
| 2008/0073752 A1 | 3/2008 | Asai et al. | |
| 2008/0088020 A1 | 4/2008 | Miyajima et al. | |
| 2008/0230807 A1* | 9/2008 | Kuroda et al. | 257/197 |
| 2009/0130996 A1 | 5/2009 | Kudaishi et al. | |
| 2009/0153237 A1 | 6/2009 | Tanzawa | |
| 2009/0309134 A1* | 12/2009 | Nishio et al. | 257/192 |
| 2010/0181674 A1 | 7/2010 | Tabatabaie et al. | |
| 2012/0038385 A1 | 2/2012 | Eaglesham et al. | |
| 2012/0061802 A1 | 3/2012 | Nicholas et al. | |
| 2012/0218047 A1 | 8/2012 | Costa et al. | |
| 2013/0099287 A1 | 4/2013 | Moser et al. | |
| 2013/0137199 A1 | 5/2013 | Cismaru et al. | |
| 2013/0140607 A1 | 6/2013 | Cismaru et al. | |

FOREIGN PATENT DOCUMENTS

KR  10-2008-054040 B1  6/2008
WO  WO 2004/084272 A2  9/2004

OTHER PUBLICATIONS

International Search Report and Written Opinion re International Application No. PCT/US2012/065090 mailed on Apr. 1, 2013.

* cited by examiner

DEVICES AND METHODS RELATED TO A BARRIER FOR METALLIZATION OF A GALLIUM BASED SEMICONDUCTOR

CROSS-REFERENCE TO RELATED APPLICATIONS

This application claims priority to U.S. Provisional Application No. 61/560,400 filed Nov. 16, 2011 and entitled "DEVICES AND METHODOLOGIES RELATED TO TaN BARRIER FOR METALLIZATION OF InGaP," which is expressly incorporated by reference herein in its entirety.

BACKGROUND

1. Field

The present disclosure generally relates to structures and fabrication processes associated with bipolar transistors.

2. Description of the Related Art

A bipolar junction transistor (BJT) typically includes two back-to-back p-n junctions formed by a base region disposed between an emitter region and a collector region. Such junctions can include a PNP configuration or an NPN configuration. The bipolar functionality results from its operation involving both electrons and holes.

A heterojunction bipolar transistor (HBT) is a type of BJT, where different semiconductor materials are utilized for the emitter and base regions to yield a heterojunction. Such a configuration can allow HBTs to be particularly useful in radio-frequency (RF) applications, including high-efficiency RF power amplifiers.

SUMMARY

According to a number of implementations, the present disclosure relates to a metallization structure that includes a selected semiconductor layer and a tantalum nitride (TaN) layer formed over the selected semiconductor layer. The selected semiconductor includes wide bandgap semiconductor lattice-matched to gallium arsenide (GaAs). The structure further includes a metal layer formed over the TaN layer, such that the TaN layer forms a barrier between the metal layer and the selected semiconductor layer.

In some embodiments, the selected semiconductor layer can include indium gallium phosphide (InGaP). In some embodiments, the TaN layer can be configured to reduce the likelihood of the metal layer contacting the InGaP layer and behaving in an ohmic manner.

In some embodiments, the structure can further include a first gallium arsenide (GaAs) layer underneath the InGaP layer. In some embodiments, the structure can further include a metal contact disposed relative to the first GaAs layer so as to facilitate electrical connection with the first GaAs layer. The InGaP layer can be dimensioned such that the metallization structure provides a capacitance density of at least 2.0 fF/$\mu m^2$ when capacitance is measured between the metal layer and the metal contact.

In some embodiments, the first GaAs layer can be part of a base of a heterojunction bipolar transistor (HBT) and the InGaP layer can be part of an emitter of the HBT. The structure can further include a second GaAs layer configured as a collector of the HBT, and a semi-insulating GaAs substrate. In some embodiment, the HBT can be configured as an NPN or PNP transistor.

In some implementations, the present disclosure relates to a packaged module having a packaging substrate configured to receive a plurality of components. The module further includes a gallium arsenide (GaAs) die mounted on the packaging substrate and has an integrated circuit (IC). The die includes a GaAs substrate and a selected semiconductor layer formed over the GaAs substrate. The selected semiconductor includes wide bandgap semiconductor lattice-matched to GaAs. The die further includes a metallization assembly having a tantalum nitride (TaN) layer formed over the selected semiconductor layer, and a metal layer formed over the TaN layer. The TaN layer forms a barrier between the metal layer and the selected semiconductor layer.

In some embodiments, the selected semiconductor layer can include indium gallium phosphide (InGaP). In some embodiments, the metallization assembly, the InGaP layer, and the GaAs substrate can form an on-die high-value capacitance element. Such an on-die capacitance element can be part of, for example, a power amplifier circuit, a tuning network circuit, or a power supply bypass circuit.

In some embodiments, the InGaP layer can be configured as an emitter of a heterojunction bipolar transistor (HBT). Such an HBT can be part of, for example, a power amplifier circuit configured to amplify a radio-frequency (RF) signal. In such an example context, the module can be a power amplifier module.

In accordance with some implementations, the present disclosure relates to a radio-frequency (RF) device having an antenna and a transceiver coupled to the antenna and configured to process a radio-frequency (RF) signal. The RF device also has an integrated circuit (IC) that is coupled to or is part of the transceiver and configured to facilitate the processing of the RF signal. The IC is implemented on a gallium arsenide (GaAs) die. The die includes a GaAs substrate and a selected semiconductor layer formed over the GaAs substrate. The selected semiconductor includes wide bandgap semiconductor lattice-matched to GaAs. The die further includes a metallization assembly having a tantalum nitride (TaN) layer formed over the selected semiconductor layer, and a metal layer formed over the TaN layer. The TaN layer forms a barrier between the metal layer and the selected semiconductor layer.

In some embodiments, the RF device can be a wireless device. In some embodiments, the IC can be part of a power amplifier configured to amplify the RF signal.

In a number of teachings, the present disclosure relates to a method for fabricating a metallization structure. The method includes providing or forming an underlying semiconductor layer, and forming a selected semiconductor layer over the underlying semiconductor layer. The method further includes forming a tantalum nitride (TaN) layer over the selected semiconductor layer, and forming a metal layer over the TaN layer.

In some implementations, the present disclosure relates to a gallium arsenide (GaAs) die that includes a GaAs substrate and a selected semiconductor layer formed over the GaAs substrate. The selected semiconductor includes wide bandgap semiconductor lattice-matched to GaAs. The die further includes a metallization assembly having a tantalum nitride (TaN) layer formed over the selected semiconductor layer, and a metal layer formed over the TaN layer. The TaN layer forms a barrier between the metal layer and the selected semiconductor layer.

In some embodiments, the selected semiconductor layer can include indium gallium phosphide (InGaP). In some embodiments, the metallization assembly, the selected semiconductor layer, and the GaAs substrate can form a high-value capacitance element. In some embodiments, the selected semiconductor layer can be configured as an emitter of a heterojunction bipolar transistor (HBT). In such a configuration, the GaAs substrate can include a first GaAs layer configured as a base and a second GaAs layer configured as a collector of the HBT.

According to some implementations, the present disclosure relates to a method for fabricating a heterojunction bipolar transistor (HBT). The method includes providing or forming a gallium arsenide (GaAs) substrate, and forming a collector layer, a base layer, and an emitter layer over the GaAs substrate. The method further includes forming a barrier layer over the emitter layer, forming a metal layer over the barrier layer, and measuring capacitance between the metal layer and the base layer, with the capacitance being representative of a thickness of the emitter layer.

In some embodiments, the emitter layer can include indium gallium phosphide (InGaP). In some embodiments, the emitter layer can include a ledge. In some embodiments, the collector layer, the base layer, and the emitter layer can be configured as an NPN transistor. In some embodiments, the barrier layer can include tantalum nitride (TaN). In some embodiments, the method can further include forming a metal contact on the base layer. In some embodiments, the method can further include adjusting a process parameter so that the capacitance is within a selected range.

In a number of implementations, the present disclosure relates to a system for monitoring a heterojunction bipolar transistor (HBT) fabrication process. The system includes a process assembly configured to form an emitter layer over a base layer, a barrier layer over the emitter layer, and a metal layer over the barrier layer. The system further includes a monitoring assembly configured to measure capacitance between the metal layer and the base layer, with the measured capacitance being representative of a thickness of the emitter layer.

In some embodiments, the emitter layer can include indium gallium phosphide (InGaP). In some embodiments, the emitter layer can include a ledge. In some embodiments, the barrier layer can include tantalum nitride (TaN).

In some embodiments, the process assembly can be further configured to form a metal contact on the base layer. In some embodiments, the system can further include a process control assembly configured to adjust a process parameter so that the capacitance is within a selected range.

According to some teachings, the present disclosure relates to a method for monitoring a semiconductor fabrication process. The method includes providing or forming an underlying semiconductor layer, and forming a selected semiconductor layer over the underlying semiconductor layer. The selected semiconductor includes wide bandgap semiconductor lattice-matched to gallium arsenide (GaAs). The method further includes forming a tantalum nitride (TaN) layer over the selected semiconductor layer, and forming a metal layer over the TaN layer. The method further includes measuring capacitance between the metal layer and the underlying semiconductor layer to obtain an estimate of a thickness of the selected semiconductor layer.

In some embodiments, the method can further include adjusting a process parameter if the measured capacitance is outside of a selected range.

In some embodiments, the thickness of the selected semiconductor layer can be calculated from the measured capacitance based on an approximation that the metal layer behaves as a portion of a parallel-plate capacitor. In some embodiments, the selected semiconductor layer can include indium gallium phosphide (InGaP). In some embodiments, the underlying semiconductor layer can include gallium arsenide (GaAs). In some embodiments, the InGaP layer and the GaAs layer can be emitter and base, respectively, of a heterojunction bipolar transistor (HBT). In some embodiments, the metal layer, the TaN layer, the InGaP layer, and the GaAs layer form a high-value capacitor having a capacitance density is at least 2.0 fF/$\mu m^2$.

According to a number of implementations, the present disclosure relates to a metallization structure that includes a first-type gallium arsenide (GaAs) layer and a second-type indium gallium phosphide (InGaP) layer disposed over the GaAs layer, with the second-type being different than the first type. The metallization structure further includes a tantalum nitride (TaN) layer disposed over the InGaP layer, and a metal layer disposed over the TaN layer.

In some embodiments, the TaN layer can be configured as a barrier layer between the metal layer and the InGaP layer to reduce the likelihood of the metallization structure behaving in an ohmic manner. The first-type GaAs layer can include a p-type GaAs layer; and the second-type InGaP layer can include an n-type InGaP layer. The metal layer includes an M1 metal layer.

In some embodiments, the metallization structure can further include a metal contact disposed relative to the GaAs layer so as to facilitate electrical connection with the GaAs layer. The InGaP layer can be dimensioned such that the structure provides a capacitance density greater than or equal to a selected value when capacitance is measured between the metal layer and the metal contact. Such a selected value of capacitance density can be at least 2.0 fF/$\mu m^2$.

In some embodiments, the first-type GaAs layer can be part of a base of a heterojunction bipolar transistor (HBT), and the second-type InGaP layer can be part of an emitter of the HBT. In some embodiments, the emitter can have a ledge.

In some implementations, the present disclosure relates to a heterojunction bipolar transistor (HBT) having a semi-insulating gallium arsenide (GaAs) substrate, a collector layer disposed over the substrate, a first-type GaAs base layer disposed over the collector, and a second-type indium gallium phosphide (InGaP) emitter layer disposed over the base layer, with the second-type being different than the first type. The HBT further includes a tantalum nitride (TaN) layer disposed over the emitter layer, and a metal layer disposed over the TaN layer.

In some embodiments, the HBT can further include a sub-collector layer disposed between the collector layer and the GaAs substrate. The sub-collector layer can include n+ GaAs, the collector layer can include n− GaAs, the base layer can include p+ GaAs, and the emitter layer can include n− InGaP.

In a number of implementations, the present disclosure relates to a gallium arsenide (GaAs) die having an integrated circuit (IC). The die includes a metallization structure that includes a first-type GaAs layer; a second-type indium gallium phosphide (InGaP) layer disposed over the GaAs layer, with the second-type being different than the first type; a tantalum nitride (TaN) layer disposed over the InGaP layer; and a metal layer disposed over the TaN layer.

In some embodiments, the metallization structure can be part of a capacitor. In some embodiments, the metallization structure can be part of a heterojunction bipolar transistor.

In accordance with some implementations, the present disclosure relates to a packaged module that includes a packaging substrate and a gallium arsenide (GaAs) die mounted on the packaging substrate and having an integrated circuit (IC). The die includes a metallization structure that includes a first-type GaAs layer; a second-type indium gallium phosphide (InGaP) layer disposed over the GaAs layer, with the second-type being different than the first type; a tantalum nitride (TaN) layer disposed over the InGaP layer; and a metal layer disposed over the TaN layer.

According to some implementations, the present disclosure relates to a radio-frequency (RF) device that includes an antenna and a transceiver coupled to the antenna and configured to process RF signals. The RF device further includes an integrated circuit (IC) that is coupled to or is part of the transceiver. The IC is implemented on a gallium arsenide (GaAs) die, and IC includes a metallization structure that includes a first-type GaAs layer; a second-type indium gallium phosphide (InGaP) layer disposed over the GaAs layer, with the second-type different than the first type; a tantalum nitride (TaN) layer disposed over the InGaP layer; and a metal layer disposed over the TaN layer.

In a number of implementations, the present disclosure relates to a method for fabricating a metallized semiconductor structure. The method includes forming or providing a first-type gallium arsenide (GaAs) layer, and forming a second-type indium gallium phosphide (InGaP) layer over the GaAs layer, with the second-type being different than the first type. The method further includes forming a tantalum nitride (TaN) layer over the InGaP layer, and forming a metal layer over the TaN layer.

In some implementations, the present disclosure relates to a method for fabricating a heterojunction bipolar transistor (HBT). The method includes providing or forming a semi-insulating gallium arsenide (GaAs) substrate, forming a collector layer over the substrate, forming a first-type GaAs base layer over the collector, and forming a second-type indium gallium phosphide (InGaP) emitter layer over the base layer, with the second-type being different than the first type. The method further includes forming a tantalum nitride (TaN) layer over the emitter layer, and forming a metal layer over the TaN layer. In some embodiments, such an HBT can include an NPN HBT.

According to some implementations, the present disclosure relates to a system for monitoring a heterojunction bipolar transistor (HBT) fabrication process. The system includes a component configured to metallized an emitter with a ledge that includes indium gallium phosphide (InGaP). The system further includes a monitoring component configured to measure capacitance associated with the metallized emitter, where the measured capacitance is representative of thickness of the emitter.

In some embodiments, the thickness of the emitter can be calculated from the measured capacitance based on an approximation that the metallized emitter behaves as a parallel-plate capacitor. In some embodiments, the system can further include a process control component configured to adjust at least a part of the HBT fabrication process if the measured capacitance or the calculated emitter thickness is outside of a desired range.

In a number of implementations, the present disclosure relates to a method for monitoring a heterojunction bipolar transistor (HBT) fabrication process. The method includes metalizing an emitter by providing or forming an indium gallium phosphide (InGaP) emitter; forming a tantalum nitride (TaN) layer and a metal layer so that the TaN layer acts as a barrier layer between the metal layer and the emitter. The method further includes measuring capacitance associated with the metallized emitter to obtain an estimate of a thickness of the emitter.

In some implementations, the present disclosure relates to a metallization structure that includes a selected semiconductor layer, a metal layer, and a tantalum nitride (TaN) layer disposed between the metal layer and the selected semiconductor layer so as to act as a barrier layer. The selected semiconductor includes wide bandgap semiconductor lattice-matched to gallium arsenide (GaAs). In some embodiments, the selected semiconductor layer can include an indium gallium phosphide (InGaP) layer.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 13/675,878, titled "SYSTEMS AND METHODS FOR MONITORING HETEROJUNCTION BIPOLAR TRANSISTOR PROCESSES" filed on even date herewith and hereby incorporated by reference herein in its entirety.

DETAILED DESCRIPTION OF SOME EMBODIMENTS

Figure 1A:
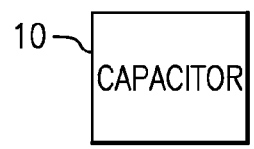
FIGS. 1A and 1B schematically depict a capacitor such as a high-value capacitor and a heterojunction bipolar transistor (HBT) having one or more features as described herein.

The headings provided herein, if any, are for convenience only and do not necessarily affect the scope or meaning of the claimed invention.

InGaP (indium gallium phosphide)/GaAs (gallium arsenide) heterojunction bipolar transistors (HBT) are widely used for wireless applications since they have excellent features such as high power density and high efficiency. InGaP emitter structures can offer significant performance advantages over AlGaAs emitter structures. For example, InGaP emitter HBTs can exhibit improvements in temperature and bias stability, as well as significantly enhanced reliability. Further InGaP emitter HBTs can also be easier to fabricate.

Performance and reliability of an HBT can be greatly influenced by an emitter and the effectiveness of its ledge. Such a ledge typically reduces the recombination current to thereby provide better device scaling and improved reliability. Such effectiveness in desirable functionality can be based on the thickness of the emitter/ledge.

For the purpose of description herein, it will be assumed that an emitter of an HBT includes a ledge feature. Such a combination is sometimes referred to as an "emitter/ledge" or simply as an "emitter." It will be understood, however, that one or more features of the present disclosure can also be implemented in HBTs where an emitter does not include a ledge.

Given the importance of the HBT's emitter thickness, monitoring the quality of such a thickness can allow for better in-line quality control and wafer screening. In an AlGaAs HBT process, a ledge monitor can be achieved by using a first interconnect metal (M1) layer as a top electrode. The metal layer, such as a Ti/Pt/Au stack, can be deposited directly on the AlGaAs passivation ledge to form a MIS (metal-insulator-semiconductor) capacitor between M1 and the HBT base (e.g., p+ base). In-line capacitance measurements of such a structure can allow for the monitoring of the AlGaAs ledge thickness and quality. However, with the InGaP HBT processes, such a metallization structure does not work, since the metal applied to InGaP does not form a high quality Schottky contact. In some situations, application of the metal (used in the foregoing AlGaAs HBT process) in the InGaP HBT process can result in the metal punching through the InGaP ledge and behave in an ohmic manner.

Described herein are devices and methodologies related to a metallization structure that allows effective way of monitoring of InGaP ledges. As described herein, such an InGaP ledge can be part of a GaAs HBT, and/or a high-value capacitor.

In some implementations, TaN (tantalum nitride) can be utilized as a barrier between a first metal (M1) and the InGaP layer. Properties or functionalities that can be provided by a TaN layer in such a configuration can include, for example, barrier functionality, improved adhesion, reduced diffusion, reduced reactivity with metals or dielectrics, and/or stability during fabrication process. Although described in the context of TaN material, it will be understood that materials having similar properties can also be utilized. For example, TiN (titanium nitride) and NbN (niobium nitride) are metal nitride materials that can also be utilized in similar applications, including GaAs processes. In the context of TaN material, a TaN barrier layer between M1 and InGaP layer can be formed using deposition methods such as physical vapor deposition (PVD) such as sputtering, evaporation, chemical vapor deposition (CVD), metal organic CVD (MOCVD), plasma assisted CVD (PACVD), and metal organic atomic layer deposition (MOALD). Such a TaN barrier layer can have a thickness in a range of, for example, 10 nm to 200 nm, 20 nm to 100 nm, 30 nm to 70 nm, or 40 nm to 60 nm. In the various examples described herein, the TaN barrier layer has a thickness of about 50 nm.

Similarly, although described in the context of InGaP semiconductor and process, it will be understood that one or more features of the present disclosure can also be implemented in other semiconductor materials and processes, including other HBT processes. For the purpose of description herein, semiconductor materials such as InGaP are sometimes referred to as selected semiconductors. InGaP is an example of wide bandgap semiconductor lattice-matched to gallium arsenide (GaAs). Accordingly, selected semiconductors can include wide bandgap semiconductors that are lattice-matched, substantially lattice-matched, or capable of being lattice-matched to GaAs.

FIG. 1A schematically shows that one or more features related to metallization of InGaP (such as an InGaP emitter) with a barrier (such as a TaN layer) can be implemented in a capacitor 10. In some embodiments, such a capacitor can have a relatively high-value capacitance density of about 3 $fF/\mu m^2$ at about zero volt, which is about twice as much as that of a similarly sized stack capacitor. In some embodiments, a capacitor having metallized InGaP with a TaN barrier as described herein can have a capacitance density that is at least 2.8 $fF/\mu m^2$, 2.5 $fF/\mu m^2$, or 2.0 $fF/\mu m^2$.

Figure 1B:
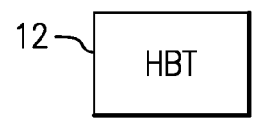

FIG. 1B schematically shows that one or more features related to the metallization of InGaP as described herein can be implemented in an HBT 12. In some embodiments, such an HBT can have an InGaP emitter whose quality (such as thickness) can be monitored during fabrication. Examples of such ledge monitoring are described herein in greater detail.

Figure 2:
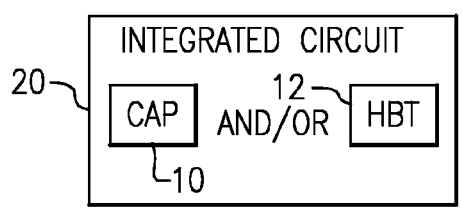
FIG. 2 shows that in some implementations, an integrated circuit (IC) can include the capacitor and/or the HBT of FIG. 1.

FIG. 2 shows that in some embodiments, a capacitor 10 and/or an HBT 12 having one or more features as described herein can be implemented in an integrated circuit (IC) 20. In the context of the HBT 12, the IC 20 can include circuits that utilize HBTs. For example, the IC 20 can include radio-frequency (RF) related circuits where high power efficiency is desired. More specifically, the IC 20 can include circuits for RF power amplifiers configured for wireless devices. In the context of the capacitor 10, the IC 20 can include circuits where high capacitance density is desired. More specifically, power amplifiers, tuning networks, and power supply bypass circuits are examples where one or more of such capacitors can provide beneficial functionalities.

Figure 3:
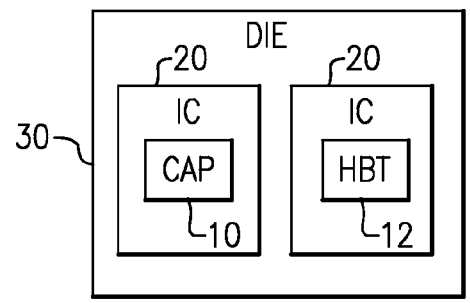
FIG. 3 shows that one or more ICs of FIG. 2 can be implemented on a semiconductor die.

FIG. 3 shows that in some embodiments, one or more ICs of FIG. 2 can be implemented as part of a semiconductor die 30. In the example shown, a first IC 20 is depicted as including a high-value capacitor 10; and a second IC 20 is depicted as including an HBT 12. As described in reference to FIG. 2, it will be understood that each of the example ICs can include either or both of the capacitor 10 and the HBT 12.

In some implementations, the die 30 can include a GaAs die. In some embodiments, the die 30 can be configured for mounting onto a substrate such as a laminate to accommodate wirebond or flip-chip connections.

Figure 4A:
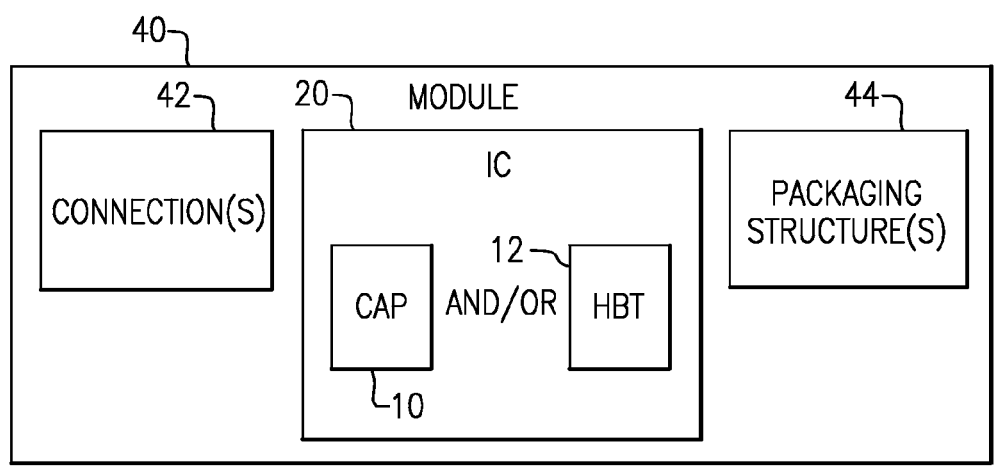
FIG. 4A schematically shows that in some implementations, a packaged module can include one or more ICs of FIG. 2.

FIG. 4A schematically shows that in some embodiments, an IC 20 having a capacitor 10 and/or an HBT 12 as described herein can be implemented in a packaged module 40. In some embodiments, such an IC can be implemented on a die (e.g., die 30 of FIG. 3). The module 40 can further include one or more packaging structures 44 that provide, for example, a mounting substrate and protection for the IC 20 of the die 30. The module 40 can further include connection features 42 such as connectors and terminals configured to provide electrical connections to and from the IC 20.

Figure 4B:
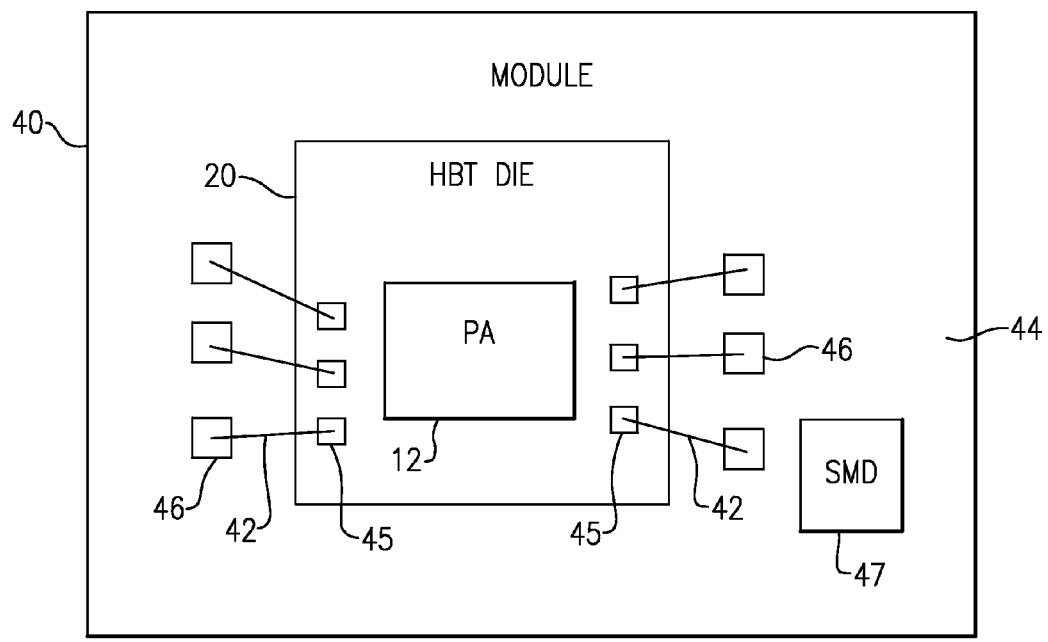
FIGS. 4B and 4C show different views of a more specific example of the packaged module of FIG. 4A.
Figure 4C:
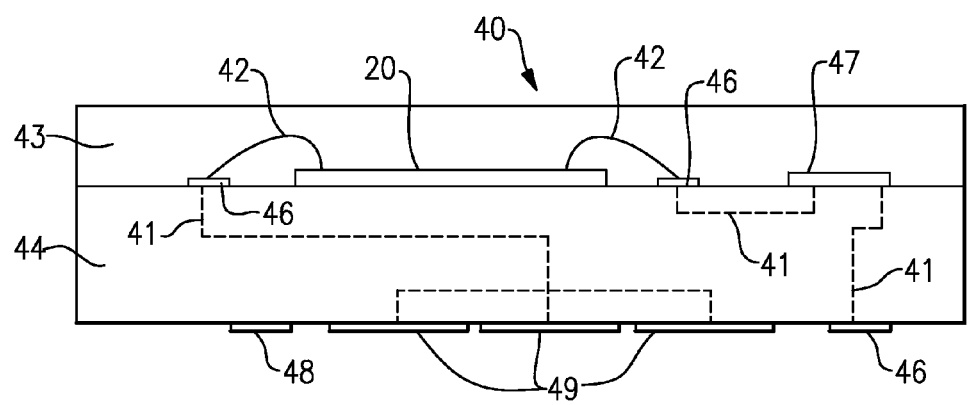

FIGS. 4B and 4C show a plan view and a side view of a module 40 that can be a more specific example of the module 40 of FIG. 4A. The example module 40 can include a packaging substrate 44 that is configured to receive a plurality of components. In some embodiments, such components can include an HBT die 20 having one or more featured as described herein. For example, the die 20 can include an HBT and/or a capacitor having one or more features described herein. In some embodiments, such an HBT and/or a capacitor can be part of a power amplifier 12. A plurality of connection pads 45 formed on the die 20 can facilitate electrical connections such as wirebonds 42 to connection pads 46 on the substrate 44 to facilitate passing of various signals to and from the die 20.

In some embodiments, the components mounted on the packaging substrate 44 or formed on or in the packaging substrate 44 can further include, for example, one or more surface mount devices (SMDs) (e.g., 47) and one or more matching networks (not shown). In some embodiments, the packaging substrate 44 can include a laminate substrate.

In some embodiments, the module 40 can also include one or more packaging structures to, for example, provide protection and facilitate easier handling of the module 40. Such a packaging structure can include an overmold 43 formed over the packaging substrate 44 and dimensioned to substantially encapsulate the various circuits and components thereon.

It will be understood that although the module 40 is described in the context of wirebond-based electrical connections, one or more features of the present disclosure can also be implemented in other packaging configurations, including flip-chip configurations.

Figure 5A:
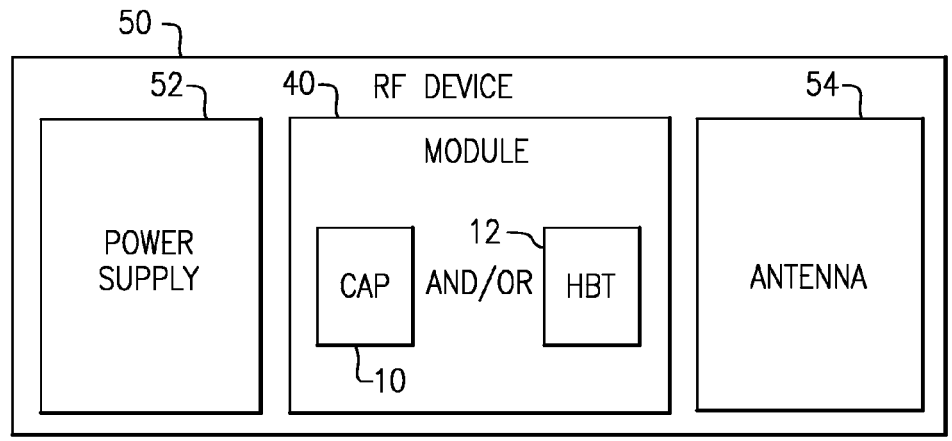
FIG. 5A schematically shows that in some implementations, a radio-frequency (RF) device such as a wireless device can include the module of FIG. 4.

FIG. 5A schematically shows that in some embodiments, a component such as the module 40 of FIG. 4 can be included in an RF device 50. Such an RF device can include a wireless device such as a cellular phone, smart phone, tablet, or any other portable device configured for voice and/or data communication. In FIG. 5A, the module 40 is depicted as including a capacitor 10 and/or an HBT 12 as described herein. The RF device 50 is depicted as including other common components such an antenna 54, and also configured to receive or facilitate a power supply 52 such as a battery.

Figure 5B:
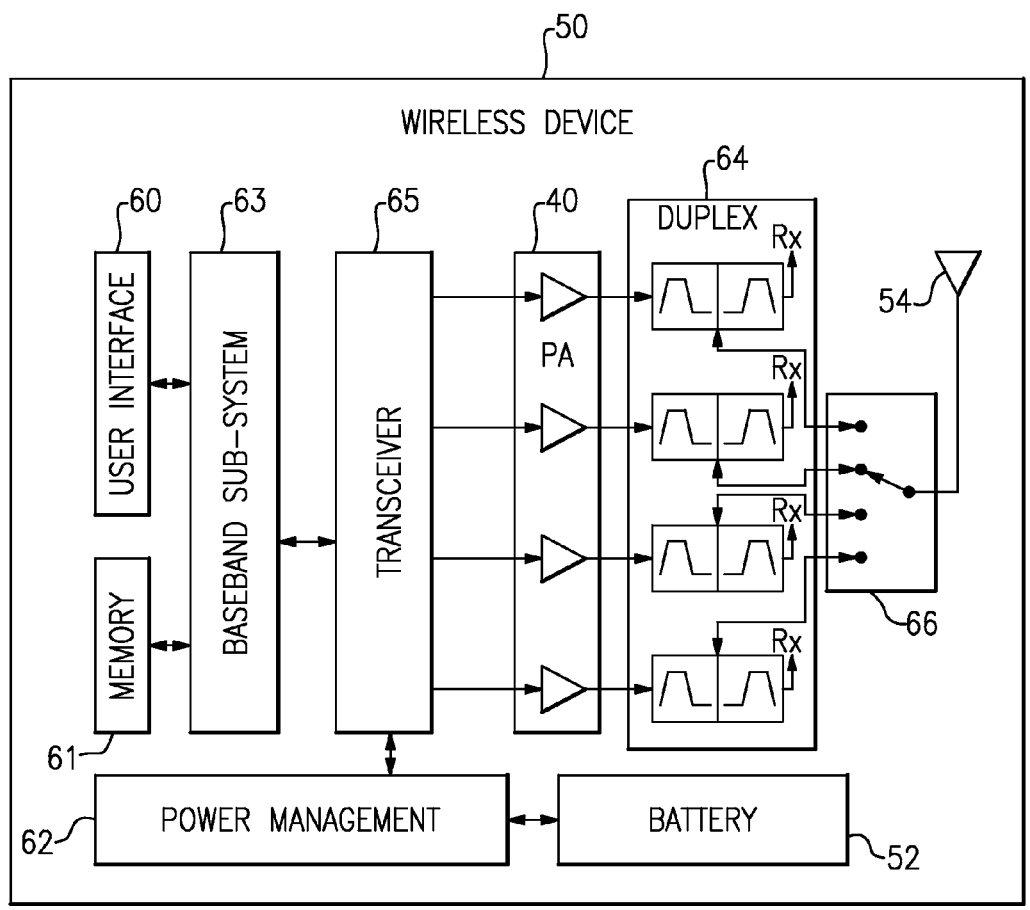
FIG. 5B shows a more specific example of a wireless device.

FIG. 5B shows a more specific example of how the wireless device 50 of FIG. 5A can be implemented. In FIG. 5B, an example wireless device 50 is shown to include a module 40 (e.g., a PA module) having one or more features as described herein. For example, the PA module 40 can include a plurality of HBT power amplifiers 12 configured to provide amplifications for RF signals associated with different bands and/or modes.

In the example wireless device 50, the PA module 40 can provide an amplified RF signal to the switch 66 (via a duplexer 64), and the switch 66 can route the amplified RF signal to an antenna 54. The PA module 40 can receive an unamplified RF signal from a transceiver 65 that can be configured and operated in known manners. The transceiver 65 can also be configured to process received signals. The transceiver 65 is shown to interact with a baseband sub-system 63 that is configured to provide conversion between data and/or voice signals suitable for a user and RF signals suitable for the transceiver 65. The transceiver 65 is also shown to be connected to a power management component 62 that is configured to manage power for the operation of the wireless device 50. Such a power management component can also control operations of the baseband sub-system 63 and other components of the wireless device 50.

The baseband sub-system 63 is shown to be connected to a user interface 60 to facilitate various input and output of voice and/or data provided to and received from the user. The baseband sub-system 63 can also be connected to a memory 61 that is configured to store data and/or instructions to facilitate the operation of the wireless device, and/or to provide storage of information for the user.

In some embodiments, the duplexer 64 can allow transmit and receive operations to be performed simultaneously using a common antenna (e.g., 54). In FIG. 5B, received signals are shown to be routed to "Rx" paths (not shown) that can include, for example, a low-noise amplifier (LNA).

The example duplexer 64 is typically utilized for frequency-division duplexing (FDD) operation. It will be understood that other types of duplexing configurations can also be implemented. For example, a wireless device having a time-division duplexing (TDD) configuration can include respective low-pass filters (LPF) instead of the duplexers, and the switch (e.g., 66 in FIG. 5B) can be configured to provide band selection functionality, as well as Tx/Rx (TR) switching functionality.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Figure 6:
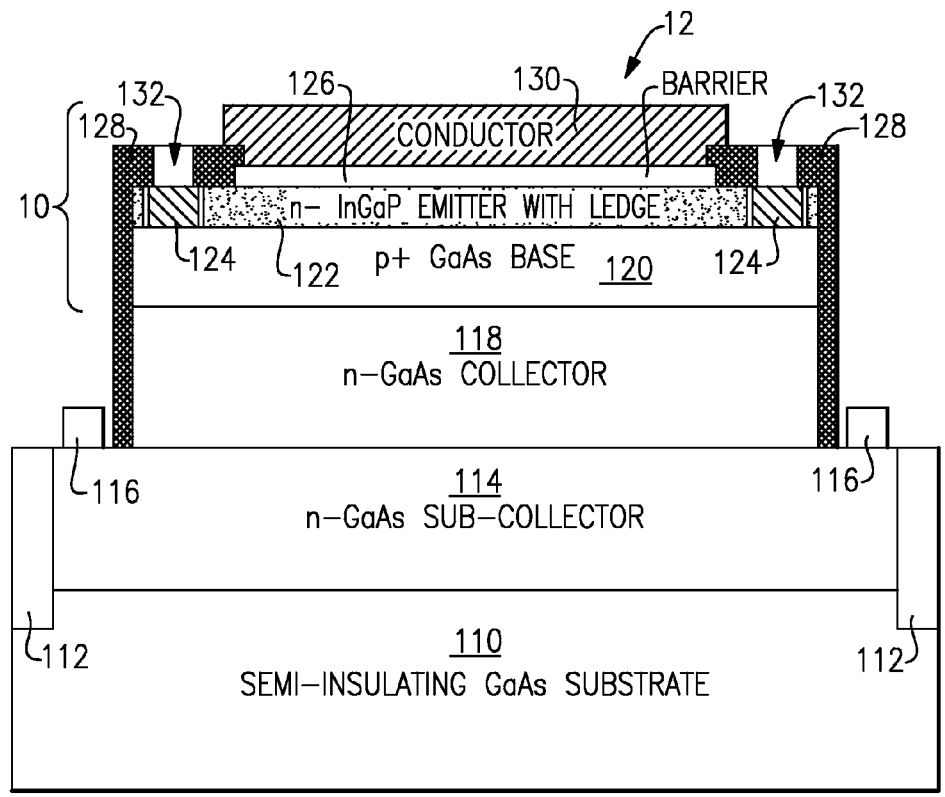
FIG. 6 shows an example configuration of an HBT having a barrier layer such as a tantalum nitride (TaN) layer disposed between an emitter having a ledge and an M1 conductor.

FIG. 6 shows an example of an HBT 12 structure having an InGaP emitter (with a ledge) 122 (such as an n– InGaP) metallized with a conductor 130 (such as an M1 layer) over a barrier layer 126 (such as a TaN layer). Such a metallized emitter is shown to be disposed over a base layer 120 (such as a p+ GaAs layer). Base contacts 124 are shown to be disposed over the base layer 120 so as to facilitate electrical connection with the base layer 120. For the purpose of description, an assembly that includes the M1 layer 130, the TaN barrier layer 126, the InGaP emitter 122, the base layer 120, and the base contacts 124 can be considered to be a high-value capacitor 10. Additional details concerning such a capacitor are described herein.

FIG. 6 further shows that the foregoing assembly that can act as the capacitor 10 can be disposed over a collector layer 118 (such as an n– GaAs layer). The collector layer 118 can, in turn, be disposed over a sub-collector layer 114 (such as an n+ GaAs layer). Collector contacts 116 can also be disposed over the sub-collector layer 114. The sub-collector layer 114 can, in return, be disposed over a semi-insulating layer 110 (such as a semi-insulating GaAs substrate).

FIG. 6 further shows that a passivation structure 128 can be formed about the emitter 122 and the base 120. Access to the base contacts 124 is shown to be provided by openings 132 defined by the passivation structure 128. The HBT 12 can further include isolation structures 112 configured to provide isolation for the HBT 12.

Although the example HBT structure 12 is described in the context of an NPN GaAs configuration, other configurations such as PNP GaAs can also benefit from one or more features as described herein. Further, a concept of metalizing an emitter layer of an HBT with a barrier layer such as a TaN layer can also be implemented in other types of HBTs.

Figure 7:
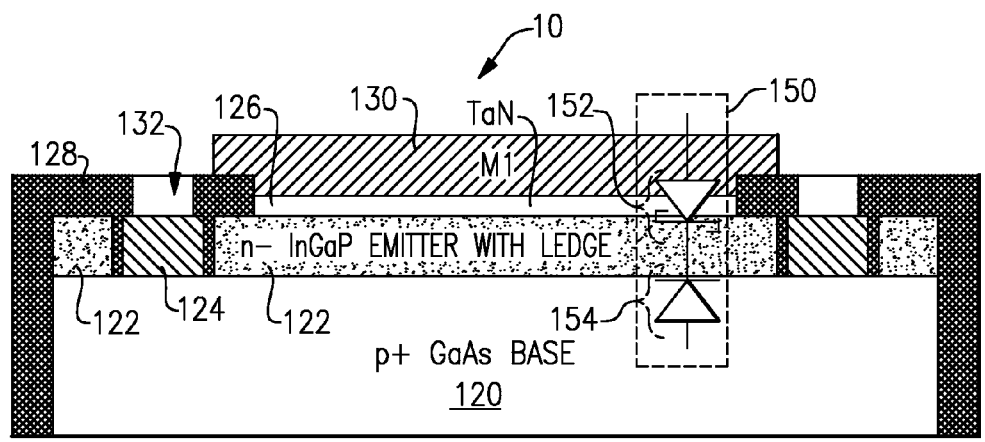
FIG. 7 shows a portion of the example HBT of FIG. 6 that can function as a high-value capacitor.

FIG. 7 shows an enlarged view of the capacitor structure 10 described in reference to FIG. 6. In the example configuration shown, a TaN layer can be used as the barrier layer 126, and an M1 metal layer can be used as the conductor 130. An assembly formed in the foregoing manner can yield a diode configuration 150 having a Schottky behavior (depicted as 152) for the M1 electrode 130, leading to a desired MIS capacitor formation. The junction between the base layer 120 and the emitter layer 122 can behave as a diode 154 as shown.

In some embodiments, as described in reference to FIG. 6, the capacitor structure 10 can be a part of an HBT (12) structure. In some embodiments, the capacitor structure 10 can be utilized as a high-value capacitor without being associated with an HBT.

Figure 8A:
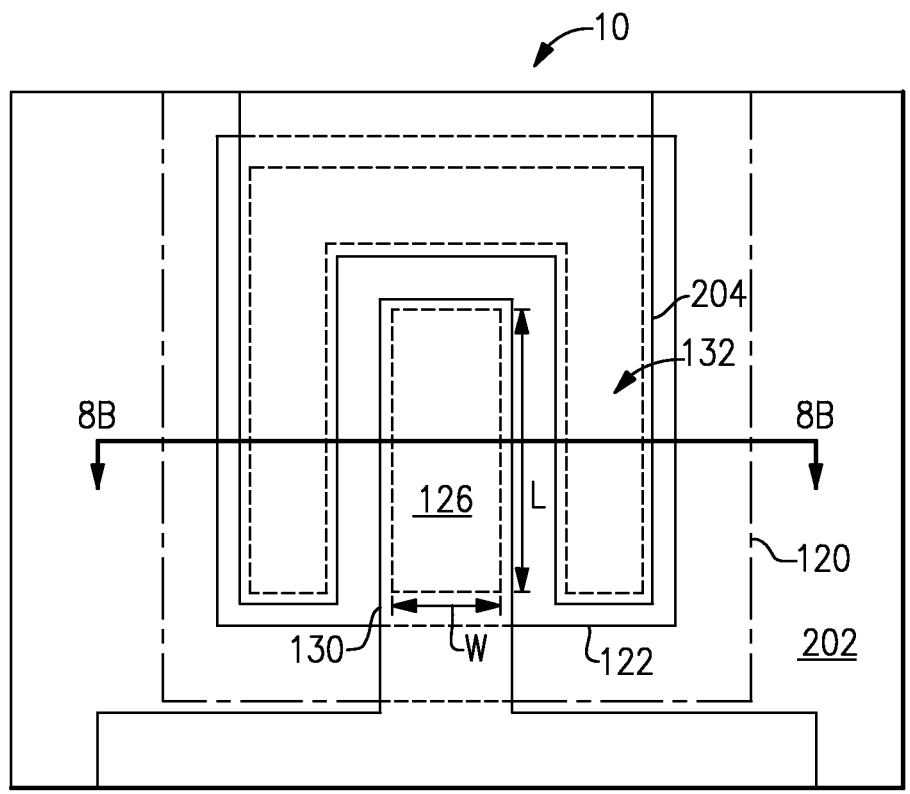
FIGS. 8A and 8B show layout and side sectional views of the example capacitor of FIG. 7.
Figure 8B:
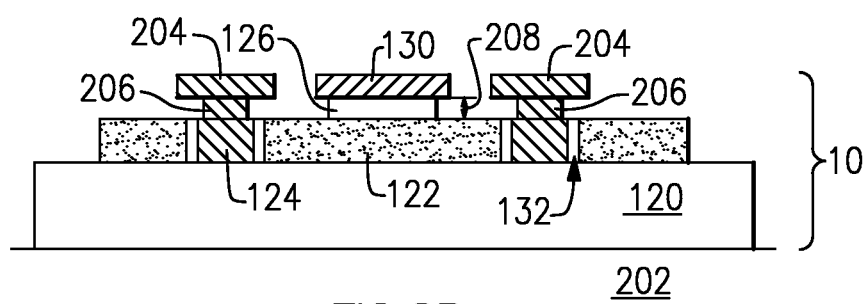

FIGS. 8A and 8B show layout and side sectional views of an example capacitor structure 10 that can be implemented based on the examples of FIGS. 6 and 7. A base layer 120 is depicted as being a rectangular shaped region formed over an underlying layer 202. An emitter (with a ledge) 122 is depicted as being a rectangular region formed over and within the area of the base layer 120. An opening 132 for providing electrical connections to base contacts 124 (not shown in FIG. 8A) is depicted as a via having a footprint in an inverted-U shape. As shown in FIG. 8B, the base contacts 124 are shown to be connected to an M1 metal layer 204 through conductors 206. The example M1 metal layer 204 is depicted as also having an inverted-U shaped footprint.

FIGS. 8A and 8B further show that a TaN barrier layer 126 can be formed over the emitter 122 and have a rectangular shaped footprint. Such a rectangle can be dimensioned (length L and width W) so as to be nested within the inverted-U shape of the M1 metal layer 204. The TaN barrier layer 126 is also depicted as having a thickness (208 in FIG. 8B). An M1 metal layer 130 is shown to be formed over the TaN barrier layer 126 and have an inverted-T shaped footprint. The TaN layer 126 can be dimensioned so that the leg portion of the T-shape covers the TaN barrier 126 and also be nested within the inverted-U shape of the M1 metal layer 204.

Figure 9:
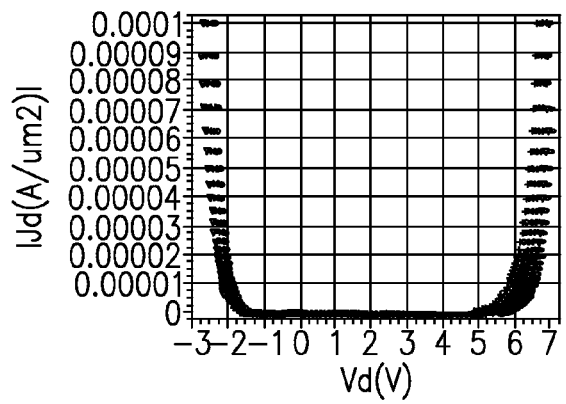
FIG. 9 shows that the example metallization structure of FIGS. 7 and 8 can behave as a diode and not in an ohmic manner.

FIG. 9 shows I-V curves for the capacitor structure 10 (FIGS. 7 and 8) having different values of the TaN layer area. The measured (between the emitter terminal 130 and the base terminal 204) I-V curves show that the devices tested have a desired Schottky behavior indicative of desired InGaP ledge thicknesses and quality. If the InGaP ledge is too thin, such an I-V curve can behave almost like a tunnel diode (with very low turn-on voltage due to the thin InGaP layer) between the TaN layer and the p-type base layer.

Figure 10:
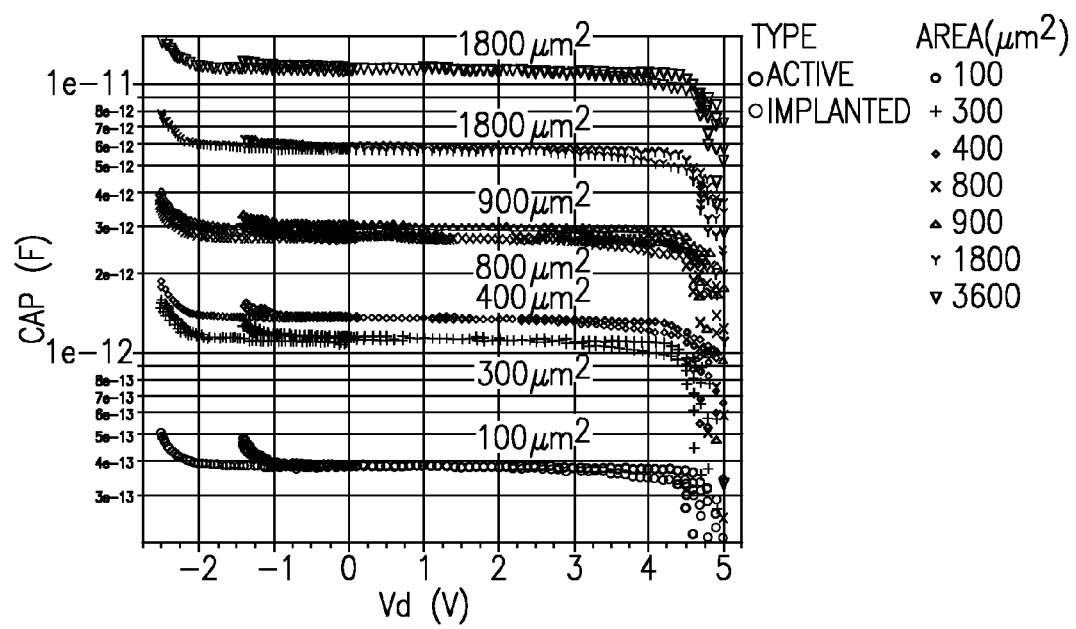
FIG. 10 shows examples of capacitance values measured for the metallization structure of FIGS. 7 and 8 having different areas for the TaN layer.

FIG. 10 shows capacitance curves (measured between the emitter terminal 130 and the base terminal 204) as a function of voltage for the capacitor structure 10 (FIGS. 7 and 8) having different values of the TaN layer area. Since the capacitor structure 10 can be approximated as a parallel-plate capacitor (where capacitance C is proportional to area), the measured capacitance values increase as the area increases, as expected. Since the parallel-plate capacitance C is also inversely proportional to the gap distance between the electrodes, a measured capacitance value will be approximately inversely proportional to the thickness of the emitter for a given TaN layer area. Accordingly, such capacitance measurement can provide information about the emitter thickness. An example application of such thickness determination is described herein in greater detail.

FIG. 10 further shows that one or more layers of the capacitor structure 10 can be configured to adjust its operating voltage range. For example, each of the area cases shown, data points include those belonging to "active" and "implanted" configurations. In the plots, the "implanted" data points generally start from the left side (less than −2V), and the "active" data points generally start from about −1.5V. For the purpose of description herein, an active configuration refers to epitaxial layers as grown; and an implant configuration refers to a damage implant in a process meant to disrupt the crystal lattice and thus provide electrical isolation between devices. In the context of the example of FIG. 10, the implant may damage both the emitter and the base, although its target is much deeper. The active cases are shown to have a desirable operating range (where capacitance is generally flat) between about −1V to about +4V, while the implanted cases generally operate between about −2V to about +3V.

Figure 11:
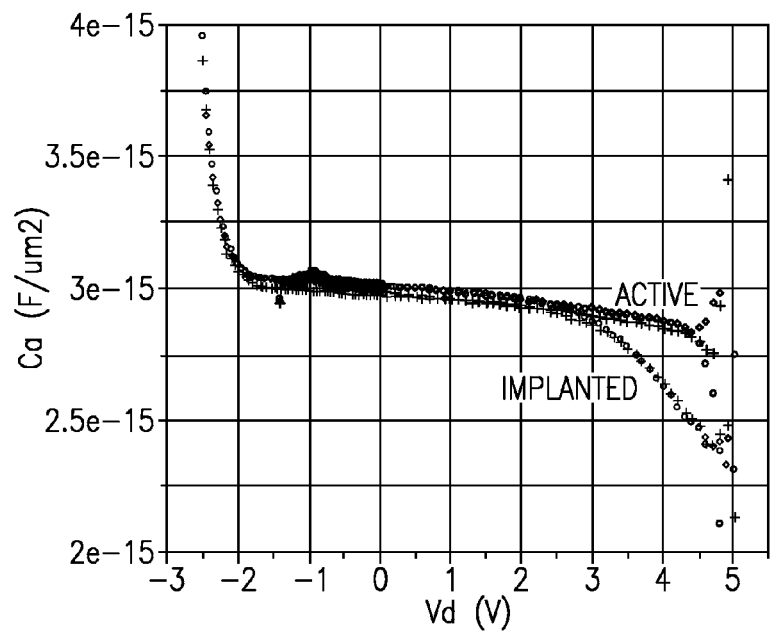
FIGS. 11 and 12 shows additional details of the capacitance values, where active and implanted configurations can extend ranges of voltages having desired capacitance.
Figure 12:
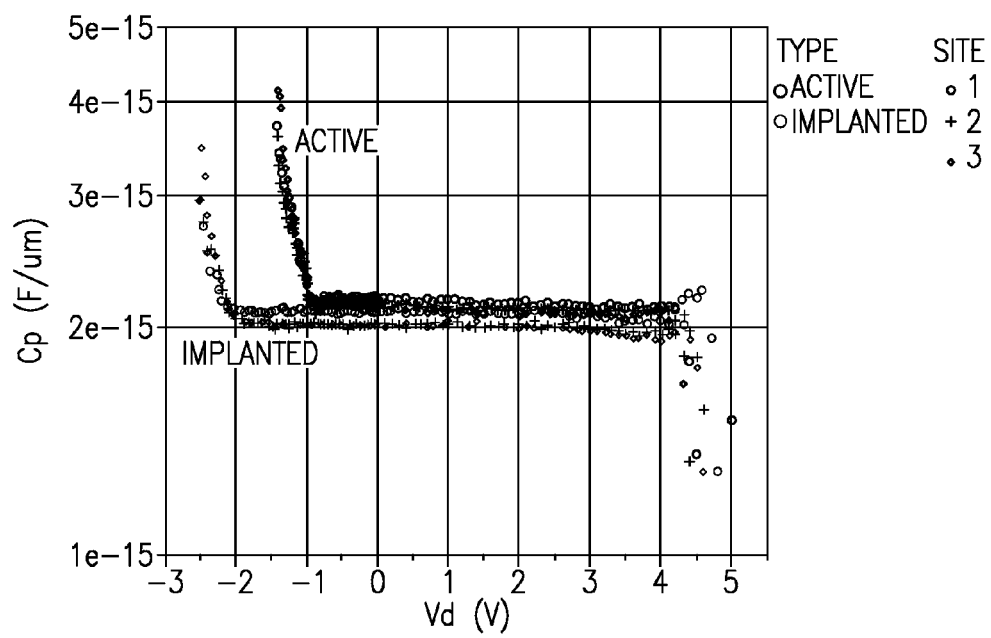

FIGS. 11 and 12 show more pronounced deviations from the desired flatness response. FIG. 11 shows a plot of area capacitance density ($F/\mu m^2$) for active and implanted cases; and FIG. 12 shows a plot of fringe (peripheral) capacitance ($F/\mu m$) of the emitter. By characterizing various area and periphery configurations, one can obtain the area component of capacitance separately from the periphery component. As described herein, both of the area and the periphery contributions can provide relatively flat response over a voltage range of interest. The foregoing methodology also allows one to better estimate capacitance of larger devices where the area component dominates.

In FIG. 11, the implanted case's deviation at about +3V is readily apparent, while the active case extends out to about +4V. In FIG. 12, the active case's deviation at about −1V is also readily apparent, while the implanted case extends out to about −2V. Accordingly, the examples in FIGS. 10-12 show that the operating voltage range can be adjusted as needed or desired. For example, if it is desired to have an extended range in the negative voltage side, implantation can provide such an extension. In another example, if it is desired to have an extended range in the positive voltage side, maintaining an active configuration can provide such an extension.

Figure 13:
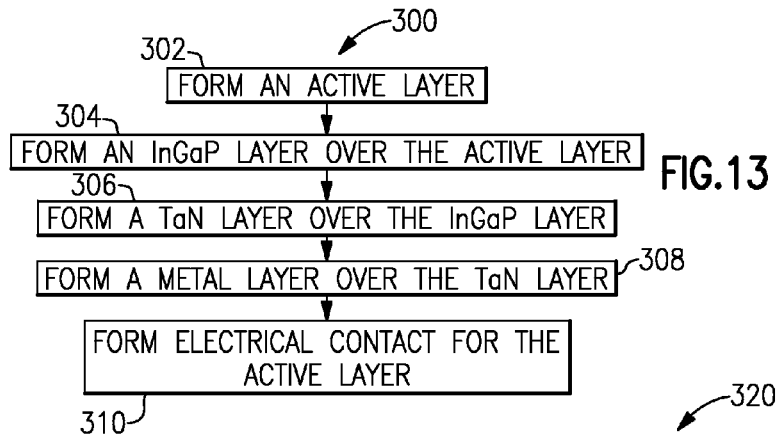
FIG. 13 shows a process that can be implemented to fabricate the example metallization structure of FIGS. 7 and 8.

FIG. 13 shows a process 300 that can be implemented to fabricate a capacitor structure having one or more features as described herein. In block 302, an active layer can be formed or provided. In some implementations, such an active layer can include a p+ GaAs layer. In block 304, an InGaP layer can be formed over the active layer. In block 306, a TaN layer can be formed over the InGaP layer. In block 308, a metal layer can be formed over the TaN layer, such that the TaN layer acts as a barrier layer between the metal layer and the InGaP layer. In block 310, an electrical contact for the active layer can be formed. In some implementations, the metal layer and the electrical contact can act as electrodes if the capacitor structure is utilized as a capacitor element.

Figure 14:
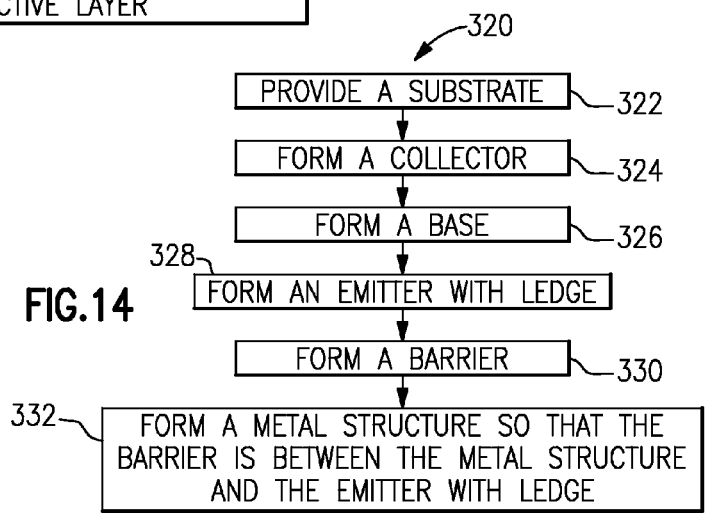
FIG. 14 shows a process that can be implemented to fabricate the example HBT structure of FIG. 6.

FIG. 14 shows a process 320 that can be implemented to fabricate an HBT structure having one or more features as described herein. In block 322, a substrate can be formed or provided. In some embodiments, such a substrate can include a semi-insulating GaAs substrate. In block 324, a collector can be formed over the substrate. In some implementations, such a collector can include an n+ GaAs sub-collector layer formed over the substrate, and an n− GaAs collector layer formed over the sub-collector layer. In block 326, a base can be formed over the collector. In some implementations, such a base can include a p+ GaAs base layer formed over the collector layer. In block 328, an emitter having a ledge can be formed over the base. In some implementations, such an emitter can include an n− InGaP emitter layer formed over the base layer. In block 330, a barrier can be formed over the emitter. In some implementations, such a barrier can include a TaN barrier layer formed over the emitter layer. In block 332, a metal structure can be formed over the barrier so that the barrier is between the metal structure and the emitter. In some implementations, such a metal structure can include an M1 metal layer formed over the barrier layer. Other structures such as contacts for the base and the collector can also be formed at appropriate stages.

Figure 15:
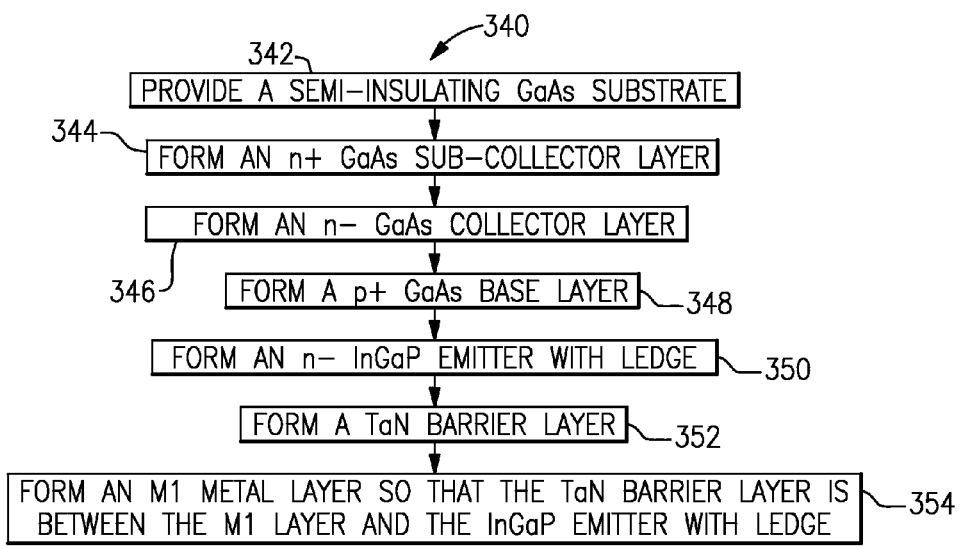
FIG. 15 shows a process that can be implemented as a more specific example of the process of FIG. 14.

FIG. 15 shows a process 340 that can be implemented as a more specific example of the process 320 of FIG. 14. In block 342, a semi-insulating GaAs substrate can be provided. In block 344, an n+ GaAs sub-collector layer can be formed over the substrate. In block 346, an n− GaAs collector layer can be formed over the sub-collector layer. In block 348, a p+ GaAs base layer can be formed over the collector layer. In block 350, an n− InGaP emitter layer can be formed over the base layer. In block 352, a TaN barrier layer can be formed over the emitter layer. In block 354, an M1 metal layer can be formed so that the TaN barrier layer is between the M1 layer and the InGaP emitter layer.

Figure 16:
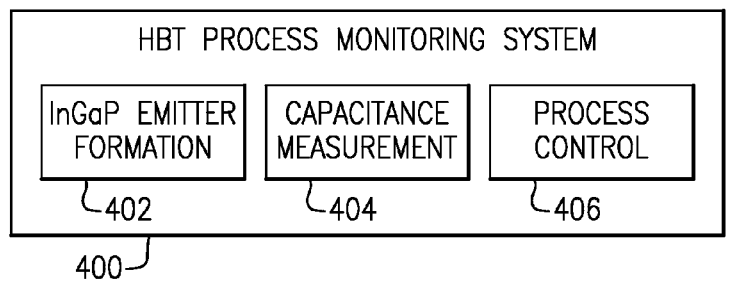
FIG. 16 schematically depicts an HBT process monitoring system capable of monitoring formation of an InGaP emitter with a ledge.

FIG. 16 shows that in some implementations, one or more features described herein can be utilized in an HBT process monitoring system 400. Such a system can include, for example, a component 402 configured to form InGaP emitters. In some implementations, such emitters can be formed on a wafer so as to facilitate fabrication of a plurality of HBT devices. The system 400 can also include a component 404 configured to perform capacitance measurements. Such a component can perform measurements of capacitance of a capacitor structure described herein, where the thickness of the emitter can influence capacitance. The system 400 can also include a component 406 configured to perform process control. Such a component can monitor the thickness of emitters being formed based on the capacitance measurements, and perform maintenance or adjustment to the emitter-formation process so as to yield emitters having desired properties such as a desired thickness.

Figure 17:
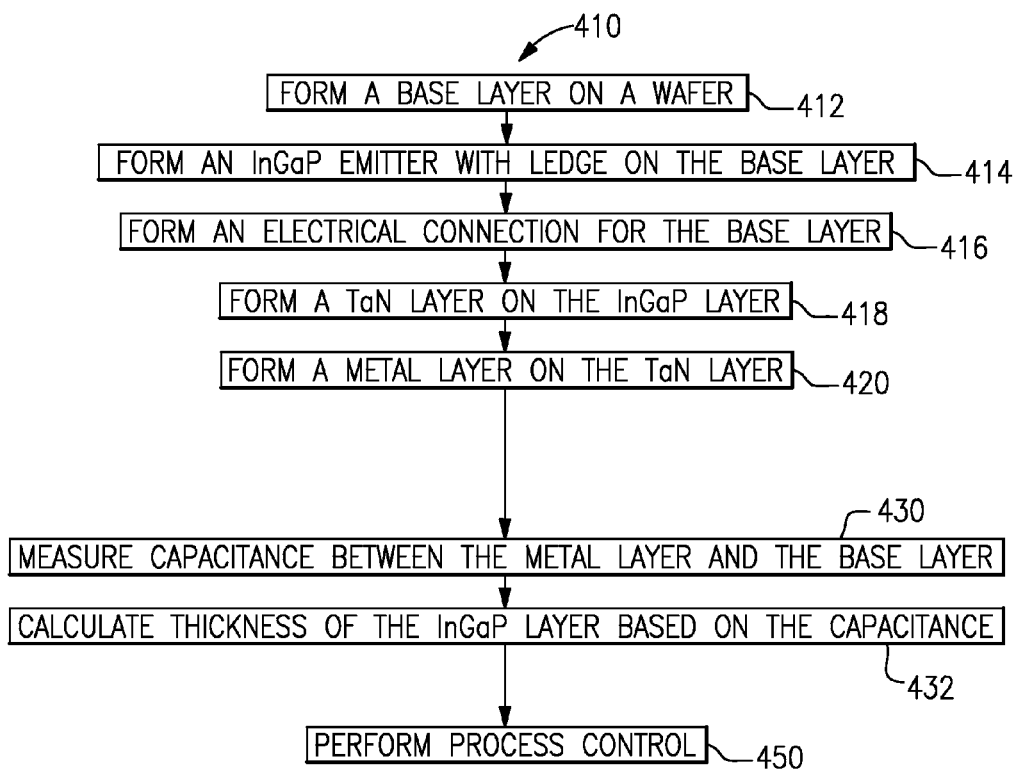
FIG. 17 shows a process that can be implemented to fabricate the InGaP emitter and metallization thereon, test the wafer to determine thickness of the emitter, and perform process control based on the test.

FIG. 17 shows a process 410 that can be performed by, or to facilitate, the HBT process monitoring system 400 of FIG. 16. The process 410 can generally include a sub-process (e.g., 412 to 420) for partial fabrication of an HBT device, a sub-process (e.g., 430 and 432) for measurement of such a device, and a sub-process (e.g., 450) for process control based on such a measurement. It will be understood that the foregoing example sub-processes can be performed at a single facility, or at two or more different facilities.

In block 412, a base layer (e.g., p+ GaAs) can be formed on a wafer. In some implementations, such a wafer can already include other HBT components (e.g., sub-collector and collector layers). In block 414, an InGaP emitter can be formed over the base layer. In block 416, an electrical connection can be formed for the base layer. In some implementations such an electrical connection can include base contacts (e.g., 124 in FIG. 6). In block 418, a TaN layer can be formed over the InGaP emitter. In block 420, a metal layer (e.g., M1 metal layer) can be formed over the TaN layer.

In block 430, capacitance can be measured between the metal layer associated with the InGaP emitter and the electrical connection associated with the base layer. In block 432, thickness of the InGaP emitter can be calculated based on the measured capacitance. An example of how such thickness can be calculated is described herein in greater detail.

In block 450, process control can be performed based on the calculated thickness of the InGaP emitter. Such process control can include, for example, maintenance or adjustment to the InGaP emitter formation process so as to yield emitters having a thickness within a desire range.

Figure 18:
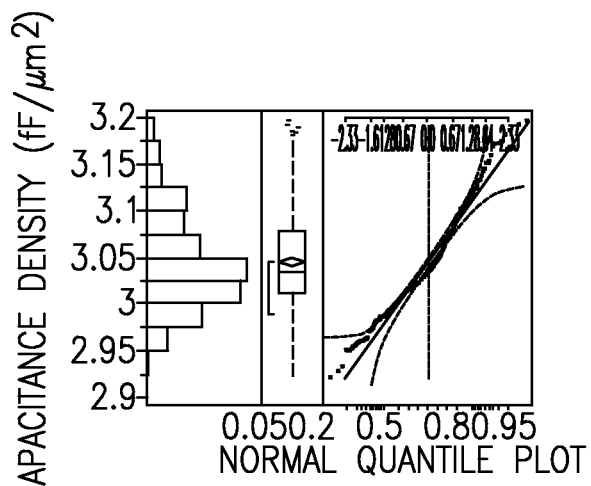
FIG. 18 shows an example distribution of measured capacitance density ($fF/\mu m^2$) across an example wafer being tested.
Figure 19:
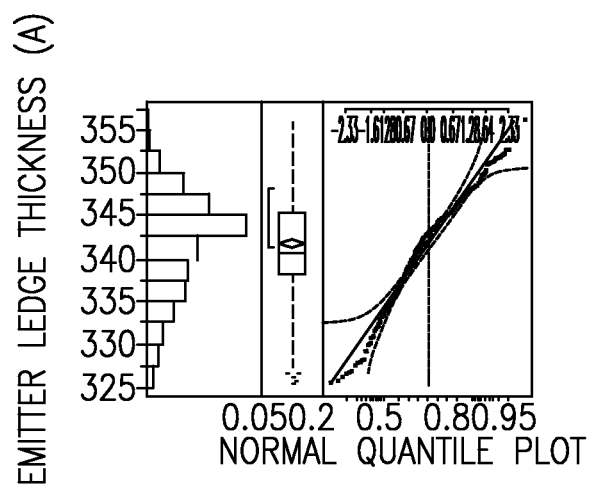
FIG. 19 shows an example distribution of ledge thickness (angstrom) calculated from the measured capacitance.
Figure 20:
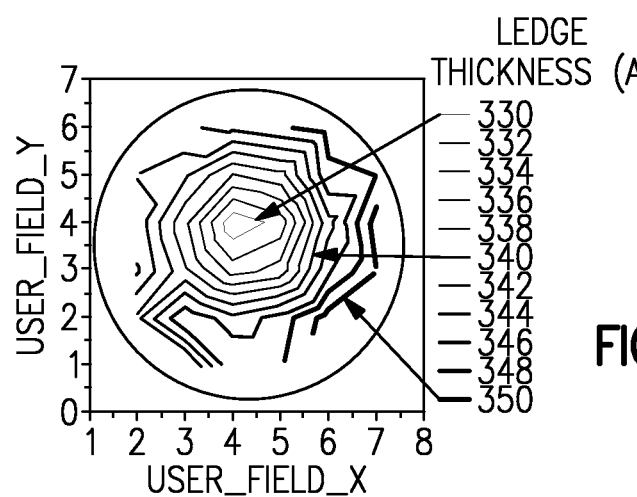
FIG. 20 shows an example of averaged ledge thickness variation across the example wafer.

FIGS. 18-20 show examples of measurements and calculated values associated with InGaP emitters formed at various locations on a sample wafer. FIG. 18 shows a normal quantile plot of capacitance density measurements as well as a distribution of the capacitance density values. As shown, the average capacitance density is about 3.00 fF/$\mu m^2$.

FIG. 19 shows a normal quantile plot of emitter ledge thickness values calculated from the capacitance measurements as well as a distribution of the thickness values. As described herein, various capacitor structures described herein can be approximated as a parallel-plate capacitor. Accordingly, capacitance C can be expressed as $$C = \frac{\varepsilon_r \varepsilon_0 A}{d},$$

where $\varepsilon_r$ represents relative permittivity or dielectric constant (about 11.75 for InGaP), $\varepsilon_0$ represents electric constant (approximately $8.854 \times 10^{-12}$ F/m), A represents area, and d represents thickness. Thus, thickness (d) values can be calculated from capacitance density (C/A) values.

A distribution of emitter thickness values across the sample wafer is depicted as a contour plot in FIG. 20. In the example shown, the center area has smaller thickness values (e.g., about 330 angstroms); and the edge portions have larger thickness values (e.g., about 350 angstroms).

Based on the foregoing, a number of process verifications and/or adjustments can be achieved. For example, suppose that an acceptable range of emitter thickness includes all of the monitored thickness values. Then, the monitoring process has verified that at least the emitter formation portion is being achieved in a desirable manner. In another example, suppose that substantially all of the monitored thickness values are outside of the acceptable range. Then, there may be some systematic problem that needs to be identified and fixed. In yet another example, suppose that thickness values are too small at one location of the wafer and/or too large at another location. Then, it may be possible to refine the emitter deposition technique to obtain a more uniform distribution of thickness values across the wafer.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A metallization structure comprising:
a selected semiconductor layer that includes wide bandgap semiconductor lattice-matched to gallium arsenide (GaAs) and that is part of an emitter of a heterojunction bipolar transistor (HBT), the emitter having a ledge that includes indium gallium phosphide (InGaP);
a first GaAs layer underneath the selected semiconductor layer and that is part of a base of the HBT;
a first metal layer disposed over and in electrical communication with the first GaAs layer, forming a base terminal of the HBT;
a tantalum nitride (TaN) layer formed over the selected semiconductor layer; and
a second metal layer formed over the TaN layer, forming an emitter terminal of the HBT, and having a portion covering the TaN layer that is nested within a region defined by a footprint of the first metal layer, the TaN layer arranged to separate the second metal layer from the selected semiconductor layer, and the TaN layer forming a barrier between the second metal layer and the selected semiconductor layer, the metallization structure forming a capacitor having a capacitance density of at least 2.0 fF/μm² when capacitance is measured between the first metal layer and the second metal layer.

2. The structure of claim 1 wherein the TaN layer is configured to reduce the likelihood of the second metal layer contacting the InGaP of the emitter and behaving in an ohmic manner.

3. The structure of claim 1 further comprising a metal contact disposed relative to the first GaAs layer so as to facilitate the electrical communication between the first GaAs layer and the first metal layer.

4. The structure of claim 3 wherein the TaN layer has a thickness of between 10 nm and 200 nm.

5. The structure of claim 1 further comprising a second GaAs layer configured as a collector of the HBT, and a semi-insulating GaAs substrate.

6. The structure of claim 1 wherein the TaN layer is in physical contact with the second metal layer.

7. A packaged module comprising:
a packaging substrate configured to receive a plurality of components; and
a gallium arsenide (GaAs) die mounted on the packaging substrate and—including (a) a GaAs substrate, (b) a selected semiconductor layer formed over the GaAs substrate and including wide bandgap semiconductor lattice-matched to GaAs, (c) a first GaAs layer underneath the selected semiconductor layer and that is part of a base of a heterojunction bipolar transistor (HBT), the selected semiconductor layer being part of an emitter of the HBT, the emitter having a ledge that includes indium gallium phosphide (InGaP), and (d) a metallization assembly having a first metal layer disposed over an in electrical communication with the first GaAs layer and forming a base terminal of the HBT, a tantalum nitride (TaN) layer formed over the selected semiconductor layer, and a second metal layer formed over the TaN layer and forming an emitter terminal of the HBT, the TaN layer separating and forming a barrier between the second metal layer and the selected semiconductor layer, the metallization assembly forming a capacitor having a capacitance density of at least 2.0 fF/μm² when capacitance is measured between the first metal layer and the second metal layer.

8. The structure of claim 1 wherein a Schottky diode is formed between the emitter terminal and the base terminal.

9. The structure of claim 8 wherein measured behavior of the Schottky diode indicates a thickness of the ledge.

10. The module of claim 7 wherein the metallization assembly, the InGaP of the emitter, and the GaAs substrate form an on-die high-value capacitance element.

11. The module of claim 10 wherein the on-die capacitance element is part of a power amplifier circuit, a tuning network circuit, or a power supply bypass circuit.

12. The module of claim 7 wherein the HBT is part of a power amplifier circuit configured to amplify a radio-frequency (RF) signal.

13. The module of claim 12 wherein the module is a power amplifier module.

14. The module of claim 10 wherein a Schottky diode is formed between the emitter terminal and the base terminal.

15. The module of claim 14 wherein measured behavior of the Schottky diode indicates a thickness of the ledge.

16. A radio-frequency (RF) device, comprising:
an antenna;
a transceiver coupled to the antenna and configured to process a radio-frequency (RF) signal; and an integrated circuit (IC) that is coupled to or is part of the transceiver and configured to facilitate the processing of the RF signal, the IC implemented on a gallium arsenide (GaAs) die, the die including (a) a GaAs substrate, (b) a selected semiconductor layer formed over the GaAs substrate and including wide bandgap semiconductor lattice-matched to GaAs, (c) a first GaAs layer underneath the selected semiconductor layer and that is part of a base of a heterojunction bipolar transistor (HBT), the selected semiconductor layer being part of an emitter of the HBT, the emitter having a ledge that includes indium gallium phosphide (InGaP), and (d) a metallization assembly having a first metal layer disposed over an in electrical communication with the first GaAs layer and forming a base terminal of the HBT, a tantalum nitride (TaN) layer formed over the selected semiconductor layer, and a second metal layer formed over the TaN layer and forming an emitter terminal of the HBT, the TaN layer separating and forming a barrier between the second metal layer and the selected semiconductor layer, the metallization assembly forming a capacitor having a capacitance density of at least 2.0 fF/$\mu m^2$ when capacitance is measured between the first metal layer and the second metal layer.

17. The RF device of claim 16 wherein the RF device is a wireless device.

18. The RF device of claim 17 wherein the IC is part of a power amplifier configured to amplify the RF signal.

19. The RF device of claim 16 wherein a Schottky diode is formed between the emitter terminal and the base terminal.

20. The RF device of claim 19 wherein measured behavior of the Schottky diode indicates a thickness of the ledge.

* * * * *